United States Patent [19]
Horiba et al.

[11] Patent Number: 5,822,194
[45] Date of Patent: Oct. 13, 1998

[54] ELECTRONIC PART MOUNTING DEVICE

[75] Inventors: Yasuhiro Horiba; Toshimi Kohmura, both of Ogaki, Japan

[73] Assignee: Ibiden Co., Ltd., Gifu, Japan

[21] Appl. No.: 716,277

[22] PCT Filed: Mar. 29, 1995

[86] PCT No.: PCT/JP95/00595

§ 371 Date: Sep. 30, 1996

§ 102(e) Date: Sep. 30, 1996

[87] PCT Pub. No.: WO95/26885

PCT Pub. Date: Feb. 12, 1995

[30] Foreign Application Priority Data

Mar. 31, 1994 [JP] Japan .................................. 6-088022

[51] Int. Cl.⁶ .................................................. H05K 1/18
[52] U.S. Cl. ..................... 361/760; 361/760; 361/761; 361/736; 361/790; 361/807; 361/809; 361/820; 257/684; 257/686; 257/687; 257/700; 257/736; 257/730; 257/710; 257/713; 174/250; 174/52.1; 174/52.2; 174/52.3; 439/591
[58] Field of Search .................................... 361/760, 761, 361/736, 790, 748, 757, 777, 783, 792, 807, 809, 820; 257/684, 686, 687, 700, 736, 730, 710, 713; 174/250, 52.1, 52.2, 52.3; 439/591

[56] References Cited

U.S. PATENT DOCUMENTS

| | | | |
|---|---|---|---|
| 5,468,999 | 11/1995 | Lin et al. | 257/784 |
| 5,583,378 | 12/1996 | Marrs et al. | 257/710 |
| 5,609,889 | 3/1997 | Weber | 425/116 |
| 5,613,033 | 3/1997 | Swamy et al. | 361/790 |

FOREIGN PATENT DOCUMENTS

| | | |
|---|---|---|
| 0 488 574 A2 | 6/1992 | European Pat. Off. . |
| SHO-60-252992 | 12/1985 | Japan . |
| SHO-61-208188 | 9/1986 | Japan . |
| SHO-62-27195 | 2/1987 | Japan . |
| SHO-62-290594 | 12/1987 | Japan . |
| HEI-3-166740 | 7/1991 | Japan . |
| HEI-4-286697 | 10/1992 | Japan . |

Primary Examiner—Leo P. Picard
Assistant Examiner—David Foster
Attorney, Agent, or Firm—Bacon & Thomas, PLLC

[57] ABSTRACT

The present invention is to provide an electronic part mounting device including: a lamination body composed of a circuit board and a structural member; an electronic part attached in an opening formed in the lamination body; and an encapsulant layer to encapsulate the electronic part, wherein an outer circumferential line of the opening is arranged inside an outer circumferential line of the encapsulant layer. Due to the foregoing arrangement, in the electronic part mounting device of the present invention, even if the device is bent, the encapsulant layer to encapsulate the electronic part is engaged with the circuit board or the structural member arranged inside the outer circumferential line of the encapsulant layer, so that electronic parts are prevented from coming off. Further, the manufacturing process is simple. Therefore, the cost of the electronic part mounting device can be greatly reduced.

7 Claims, 3 Drawing Sheets

ELECTRONIC PART MOUNTING DEVICE

TECHNICAL FIELD

The present invention relates to an electronic part mounting device having an appropriate flexibility, the durability of which is high, and further the cost of which is low.

BACKGROUND ART

Concerning an electronic part mounting device represented by an IC card, it is conventionally required that the electronic part accommodated in the device, such as a semiconductor chip and a wire coil, can be sufficiently protected and the electronic part mounting device is appropriately flexible and durable.

(1) The Unexamined Japanese Patent Application Publication No. Hei. 4-286697 discloses a personal IC card of high-performance characterized in that: both the size and the flexibility of the IC card meet the requirements of ISO Standard; a semiconductor chip accommodated in the IC card can be sufficiently protected; the IC card is embossable; the durability of the IC card is high; the cost of the IC card is low; and it is easy to manufacture the IC card. The IC card comprises: a circuit board made of polyester film that has been heat-stabilized, the length and the width of which are the same as those of the final product of the IC card; a structural member having an opening, made to adhere onto an upper surface side of the circuit board with a thermoplastic adhesive agent, the softening point of which is lower than that of the film, the length and the width of which are the same as those of the circuit board, the structural member being made of the same resin material as that of the structural circuit board; electronic parts received in the opening and attached onto the circuit board; and an encapsulant layer, the rigidity of which is greater than that of the structural member, wherein the encapsulant is charged into the opening so as to seal the electronic part.

(2) The Unexamined Japanese Patent Application Publication Nos. Sho. 60-252992, Sho. 61-208188 and Hei. 3-166740 disclose an IC card made of thermoplastic resin (polycarbonate resin), wherein the IC card is prevented from warping by a structure in which inner sheets of the same thickness, made of the same material, are symmetrically arranged on both sides of a core sheet, and further cover sheets are also symmetrically arranged on both sides of the core sheet, so that the thermal stress can be well balanced.

(3) The Unexamined Japanese Patent Application Publication No. Sho. 62-27195 discloses the following IC card for the purpose of providing a sufficiently high mechanical strength and flexibility with respect to bending. In the IC card, an IC module is embedded in the base material of the card, and the IC module includes a reinforcing member protruding in the direction of an outer circumference of the IC module.

(4) In order to enhance the reliability of an IC card in the event that bending stresses are given to the IC card, The Unexamined Japanese Patent Application Publication No. Hei. 2-235699 discloses an IC card including a means for enhancing an adhering force between an encapsulant layer to encapsulate an electronic part and a circuit board having a conductive pattern, and the means includes a plurality of holes formed close to a mounting section of the electronic part on the circuit board, and a portion of the encapsulant which covers the electronic parts is injected into the holes.

In the case of the IC card described in item (1), a sheet of polyester resin film used on the IC card is made by means of drawing. Accordingly, it has a characteristic that the thinner the sheet of polyester resin film is, the lower the degree of thermal shrinkage and expansion becomes.

Accordingly, even when sheets of polyester resin film are used which have been subjected to heat-stabilization before adhesion, when a relatively thick (about 350 $\mu$m thickness) sheet of film used for the structural member is made to adhere onto a thin sheet of film used for the circuit board, the joined body warps in the process of manufacturing an IC card. Therefore, it is difficult to manufacture the IC card.

The IC card described in item (2) is less susceptible to warp. However, when the IC card is bent, although it is an extreme condition, there is a possibility that an electronic part comes out from the opening of the structural member together with the encapsulant layer. Therefore, the use of the IC card described in item (2) is severely restricted.

According to the IC card described in item (3), the IC module containing an electronic part is prevented from coming out from the IC card. However, the structure becomes very complicated, and the manufacturing cost is raised.

According to the IC card described in item (4), the encapsulant layer to encapsulate the electronic part is made to strongly adhere onto the circuit board. However, in the actual manufacturing process of this IC card, it is necessary to use a very expensive molding machine referred to as a transfer molding machine by which the encapsulant layer is formed.

The present invention has been accomplished to solve the above problems of the prior art. It is an object of the present invention to provide an inexpensive electronic part mounting device having an appropriate flexibility and high durability, and the performance of the electronic part mounting device satisfies the requirements that the conventional IC cards meet.

DISCLOSURE OF THE INVENTION

The first invention is to provide an electronic part mounting device comprising: a lamination body composed of a circuit board and a structural member; an electronic part attached in an opening formed in the lamination body; and an encapsulant layer to encapsulate the electronic part, wherein an outer circumferential line of the opening is arranged inside an outer circumferential line of the encapsulant layer.

The second invention is to provide an electronic part mounting device according to the first invention, wherein the opening is composed of a structural member laminated on the circuit board.

The third invention is to provide an electronic part mounting device according to the second invention, wherein the structural member includes: a first structural member having a first opening, arranged on an upper surface side of the circuit board; and a second structural member having a second opening communicated with the first opening, arranged on an upper surface side of the first structural member, and an outer circumferential line of the first opening is arranged outside of an outer circumferential line of the second opening.

The fourth invention is to provide an electronic part mounting device according to the third invention, wherein the circuit board is made of thermoplastic resin, the length and width of which are substantially the same as those of the final product, the first structural member is mainly made of thermoplastic resin, the length and width of which are substantially the same as those of the circuit board, the first structural member is made to adhere onto an upper surface side of the circuit board with a thermoplastic adhesive agent which is softened at a temperature lower than the softening point of the thermoplastic resin of the circuit board, the second structural member is made to adhere onto an upper surface side of the first structural member with the substantially same adhesive agent as the above thermoplastic adhesive agent, the length and the width of the second structural member are substantially the same as those of the circuit board, and the encapsulant layer is more rigid than the circuit board and the first structural member.

The fifth invention is to provide an electronic part mounting device according to the fourth invention, wherein the thickness of the second structural member is substantially the same as the thickness of the circuit board, and the second structural member is made of substantially the same resin as the resin of the circuit board.

The sixth invention is to provide an electronic part mounting device according to the fifth invention, wherein the thermoplastic resin is a sheet of polyester film subjected to biaxial orientation and heat-stabilization, and the first structural member is made of the substantially same resin as the resin of the circuit board.

The seventh invention is to provide an electronic part mounting device according to claims 1 to 6, wherein the electronic part mounting device is an IC card.

It is possible to provide an encapsulant layer when a predetermined resin is injected into and cured in an opening portion which communicates the above structural members. However, when an electronic part such as a semiconductor chip, which are frangible to an impact, are encapsulated, a rigid resin, the rigidity of which is higher than the rigidity of the above structural members, is preferably used to encapsulate the electronic part, so that the semiconductor chip can be protected from an impact given when the electronic part mounting device is bent. On the other hand, when an electronic part such as a wire coil, which is flexible, is encapsulated, it is not necessary to use a resin having the characteristic described above.

When the electronic part mounting device of the invention is an IC card, it is common that predetermined label sheets are attached onto the front and the back side of the electronic part mounting device when the electronic part mounting device is made to be a final product. In this case, the material and thickness of the label sheets on the front side are preferably the same as those of the label sheet on the back side so as to make the thermal expansion property of the front label sheet to be the same as that of the back label sheet. In this way, the IC card can be prevented from warping. In this connection, it is preferable that the label sheet is made of thermoplastic resin such as polyvinyl chloride referred to as PVC.

The reason why the circuit board and the structural plate are specifically made from a sheet of polyester is described as follows. The price of polyester resin is lower than that of polyimide, and further polyester resin is soft and embossable, and furthermore polyester resin is not easily softened by the heat given in the process of mounting the electronic part. In this connection, polyester film includes a polyester material to which a quantity of predetermined plasticizer and stabilized are added.

In this connection, the above biaxial orientation is defined as follows. For example, polyester resin material extruded from an extruder is drawn in the longitudinal direction so that the molecular axis (fiber axis) of polyester is oriented in the longitudinal direction, and then it is drawn in the lateral direction.

This sheet of polyester film, which has been subjected to biaxial orientation, is made in such a manner that heat-stabilization treatment is conducted on the sheet of polyester film, in which the film temperature is raised to 150° C. at predetermined intervals. An amount of shrinkage of the sheet of film in an unrestricted condition that the temperature is maintained at 150° C. for 30 minutes is smaller than 0.2% in both the longitudinal and the lateral direction, and a difference between the amount of shrinkage in the longitudinal direction and the amount of shrinkage in the lateral direction is smaller than 0.1%. When the above sheet of film is used, it is possible to reduce a difference between the amount of shrinkage of the sheet of film composing the circuit board and the amount of shrinkage of the sheet of film composing the structural member, to be smaller than 0.1%.

From the viewpoints of reducing the material cost and enhancing the performance, it is preferable that the thickness of each sheet of film is not more than 250 $\mu$m, and it is more preferable that the thickness of each sheet of film is about 125 $\mu$m. The second structural member and the circuit board are preferably made of the material of the same manufacturing lot.

It is preferable that the adhesive agent used for the present invention is a thermoplastic adhesive agent, because the thermoplastic adhesive agent can appropriately absorb a strain caused between the members to be adhered so that the members can be prevented from warping. Especially when sheets of polyester resin are made to adhere to each other, it is preferable to use an adhesive agent made of ester.

According to the first invention, the electronic part mounting device includes: an electronic part attached onto a circuit board and received in an opening; and an encapsulant layer by which the electronic part is encapsulated in the opening, wherein an outer circumferential line of the opening is arranged inside of an outer circumferential line of the encapsulant layer. Accordingly, even when the electronic part mounting device is bent, the encapsulant layer to encapsulate the electronic part can be engaged with the structural member located inside of the outer circumferential line of the opening. Further, it is not necessary to use an expensive apparatus for forming the encapsulant layer.

According to the second invention, in addition to the action provided by the first invention, the following action can be provided by a step formed between the first opening and the second one. Even when the electronic part mounting device is more intensely bent and the encapsulant layer to encapsulate the electronic part is separated from the second opening, the separating portion is located only at a position close to the surface of the second opening, that is, the separating portion does not reach the first opening.

According to the third invention, the circuit board, the first structural member and the second structural member are composed to be substantially the same in length and width. Accordingly, in addition to the action provided by the second invention, this electronic part mounting device can be manufactured easily in such a manner that the first structural member and the second one are laminated on an upper surface of the circuit board, and the electronic part is mounted and then encapsulated with an encapsulant, and a surface layer is arranged on it if necessary. Further, the cost of the electronic part mounting device of the present invention is much lower than that of the conventional complicated electronic part mounting device of the prior art in which an IC module and other members must be further provided.

According to the fourth invention, the thickness of the second structural member is the same as the thickness of the circuit board, and the second structural member and the circuit board are made of the same thermoplastic resin. Further, the second structural member and the circuit board are substantially the same in length and width. In other words, the first structural member is interposed between the second structural member and the circuit board, that is, the second structural member and the circuit board are symmetrically arranged with respect to the first structural member in the upward and downward direction. Accordingly, in addition to the action provided by the third invention described above, even when a change in temperature is caused between the circuit board and each structural member in the process of mounting the electronic part so that the thermal expansion and shrinkage occur, the first structural member is stably held by the circuit board and the second structural member. Therefore, the entire electronic part mounting device is not warped, and each member composing the electronic part mounting device expands and shrinks in the substantially same condition.

According to the fifth invention, all of the circuit board, the first structural member and the second structural member are made from sheets of polyester film which have been subjected to biaxial orientation and heat-stabilization. Accordingly, in addition to the action provided by the fourth invention, it is possible to positively use an inexpensive thin sheet of polyester film, the heat expansion property of which is excellent.

According to the sixth invention, the electronic part mounting device is specified to an IC card. Actions provided by the first, second, third, fourth and fifth invention are very remarkably requested to the IC card in which the electronic part mounting device of the invention is used.

A perspective view of the developed arrangement of Embodiment 1;

[FIG. 2]

Figure 1:
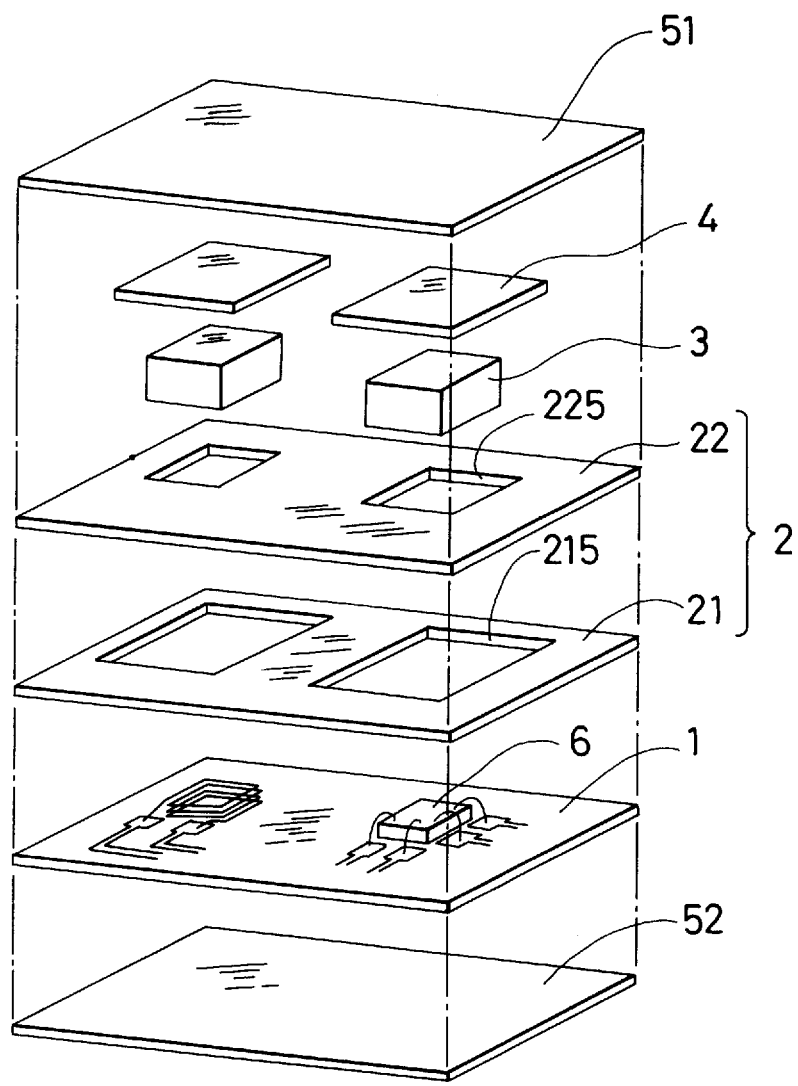
[FIG. 1]

An enlarged view of the primary portion of FIG. 1;

[FIG. 3]

A longitudinally cross-sectional enlarged view of the primary portion of Embodiment 1;

[FIG. 4]

A longitudinally cross-sectional enlarged view of the primary portion of Embodiment 2;

FIG. [5]

A longitudinally cross-sectional enlarged view of the primary portion of a variation of Embodiment 2;

[FIG. 6]

A longitudinally cross-sectional enlarged view of the primary portion of a variation of Embodiment 1.

[Reference Characters, and Names]
1 . . . Circuit board
12 . . . Layer of adhesive agent on an upper side of the circuit board
14 . . . Conductive pattern
2 . . . Structural member
21 . . . First structural member
212 . . . Upper side adhesive agent layer of the first structural member
213 . . . Lower side adhesive agent layer of the first structural member
215 . . . First opening
22 . . . Second structural member
223 . . . Lower side adhesive agent layer of the second structural member
225 . . . Second opening
23 . . . Auxiliary structural member
233 . . . Lower side adhesive agent layer of the auxiliary structural member
235 . . . Opening of the auxiliary structural member
24 . . . Auxiliary circuit board member
242 . . . Upper side adhesive agent layer on the auxiliary circuit board member
245 . . . Opening of the auxiliary circuit board member
3 . . . Encapsulant layer
4 . . . Cover sheet
51 . . . Upper side label sheet
513 . . . Lower side adhesive agent layer on the upper side label sheet
52 . . . Lower side label sheet
522 . . . Upper side adhesive agent layer on the lower side label sheet
6 . . . Electronic part

BEST MODE FOR CARRYING OUT THE INVENTION

Embodiment 1

Figure 2:
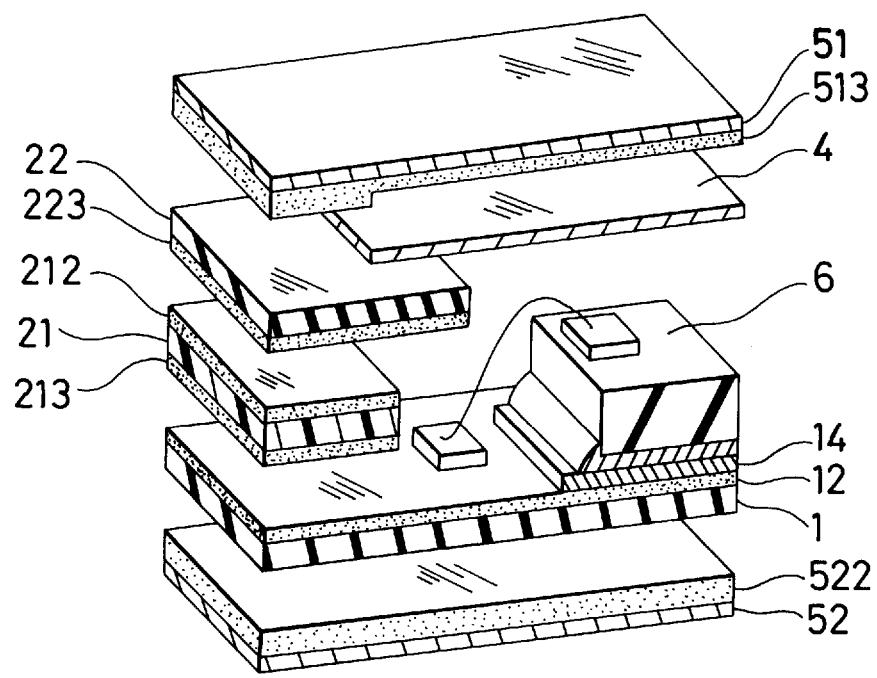
Figure 3:
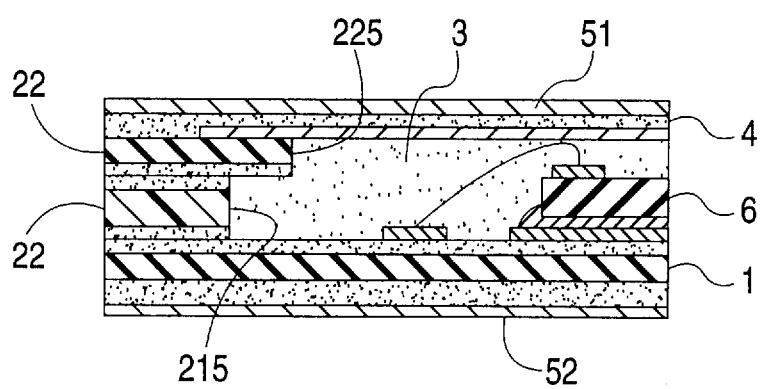

As shown in FIGS. 1 to 3, an IC card of the embodiment includes: a circuit board 1; a structural member 2 composed of a first structural member 21 attached onto an upper side of the circuit board 1, and a second structural member 22; an encapsulant layer 3; a cover sheet 4 arranged on an upper side of the encapsulant layer 3; and label sheets 51, 52 composing both surface layers.

The above circuit board 1 is made of polyester resin, which is available on the market, and the brand name of which is "Lumirror". The circuit board 1 is formed from a substantially rectangular sheet of film, the size of which is 85 mm×53 mm×125 $\mu$m. In this connection, on an upper surface side of this circuit board 1, there is provided a predetermined conductive pattern 14 which is formed as follows. A sheet of copper foil is made to adhere onto the upper surface side of this circuit board 1 with a thermoplastic adhesive agent of ester (the brand name is "A412" manufactured by Sheldahl Inc.). In this case, the softening point of the thermoplastic adhesive agent is lower than that of the circuit board, and a quantity of the thermoplastic adhesive agent is determined so that an adhesive agent layer 12 of 20 $\mu$m thickness can be formed in the final product. After the sheet of copper foil has been made to adhere onto the upper surface side of the circuit board 1 in the above manner, etching is conducted so as to form the conductive pattern 14. In order to enhance the anticorrosion property, this conductive pattern 14 is subjected to gold plating. On the circuit board 1, there are provided other electronic parts 6 such as an IC and a condenser used for transmitting data.

The structural member 2 is composed of the first structural member 21 arranged on the lower side and the second structural member 22 arranged on the upper side.

The second structural member 22 is made of the same resin as that of the circuit board 1. The size of the sheet of film from which the second structural member 22 is formed is the same as the size of the circuit board 1 (85 mm×53 mm×125 ($\mu$m). Especially, the thickness of the second structural member 22 is the same as the thickness of the circuit board 1.

As shown in FIGS. 1 to 3, in order to accommodate the electronic parts 6 to be mounted on the circuit board 1, there are provided two opening portions 215, 225 which are formed from the upper surface side on each of the structural members 21, 22 to the lower surface side. When both structural members 21, 22 are put upon each other, the opening portions are communicated with each other, so that a communication hole can be formed, and a substantially flange-shaped step portion is formed in the boundary of both openings.

In this case, as shown in FIG. 1, outer circumferential lines of the opening portions 215, 225 are approximately square. However, the opening 215 (the length of one side: 10 mm, the total length: 40 mm) arranged on the lower side is larger than the opening 225 (the length of one side: 8 mm, the total length: 32 mm) arranged on the upper side. Accordingly, when the communication hole is observed from the upper side, the outer circumferential line of the latter opening 225 is accommodated inside the outer circumferential line of the former opening 215. The shape of the outer circumferential line of each opening portion may be arbitrarily determined. The shapes of both outer circumferential lines are not necessarily the same or the similar figures. Further, both outer circumferential lines may cross each other at several points, and one of the outer circumferential lines may be arranged inside the other outer circumferential line, and at the same time some of the outer circumferential lines may be arranged outside the other outer circumferential line.

In this connection, in this embodiment, other opening portions which form other communicating holes not shown in FIGS. 2 and 3 are formed into the same shapes as those of the above opening portions 215, 225, and also the positional relation of those opening portions is the same as that of the above opening portions 215, 225. In this case, according to the size of the electronic part to be accommodated, the total length (the size of the opening) of the outer circumferential line is changed. The aforementioned positional relation is defined as a relation in which the outer circumferential line of the opening 225 of the second structural member 22 is accommodated inside the outer circumferential line of the opening 215 of the first structural member 21. However, it is not necessary that the shapes of the outer circumferential lines of the communicating holes are the same in the manner shown in this embodiment, and it is not necessary either that the positional relations of the opening portions are the same.

The cover sheet 4 covers an upper side of the communicating hole. The cover sheet 4 is made of prepreg composed of cloth (the thickness: 35 µm) impregnated with partially cured epoxy resin.

Each label sheet 51, 52 is formed from a sheet of polyvinyl chloride (85 mm×53 mm×25 µm). In this connection, when the thickness of these label sheets is increased, it is possible to positively protect the electronic parts mounted on the IC card from electrostatic discharge and contamination. In this case, it is common that the thickness of each structural member 21, 22 is adjusted, so that the overall thickness of the IC card is made to be a value of the thickness stipulated by ISO Standard.

These label sheets 51, 52 are made to adhere onto the lower surface side of the circuit board 1 and the upper surface side of the second structural member 22. The lower surface side of the circuit board 1 and the upper surface side of the second structural member 22 are subjected to sand mat treatment. The reason why sand mat treatment is conducted is described as follows. The surface of a sheet of polyester resin film composing the circuit board 1 or the second structural member 22 is very smooth. Therefore, appropriate irregularities are formed on the surface to be joined with each label sheet so that both surfaces can be more closely contacted with each other. However, in the case of the IC card of this embodiment, curing is conducted while the cover sheet 4 and the second structural member 22 are closely contacted with the lower side of the label sheet. Therefore, the aforementioned treatment may be omitted.

In the case of the IC card of this embodiment, first, the conductive pattern 14 is formed in a portion on a sheet of film corresponding to the circuit board 1.

On the other hand, on both sides of the first structural member film, there are provided predetermined quantities of thermoplastic adhesive agent of ester, so that the adhesive layers 212, 213 can be formed in the final product, and also on the lower surface of the second structural member film, there is provided a predetermined quantity of thermoplastic adhesive agent of ester, so that the adhesive layer 223 can be formed in the final product. After the adhesive layers have been coated on the surfaces, it is dried. In a portion of the first structural member film which corresponds to the first structural member 21, there is formed an opening 215, and also in a portion of the second structural member film which corresponds to the second structural member 22, there is formed an opening 225.

In this connection, in this embodiment, in order to enhance the production efficiency, a quantity of film to make the circuit board corresponding to several pieces of final products was used, however, it is possible to use a quantity of film previously divided into one piece.

Next, the lower surface of the second structural member 22 film was put upon the upper surface of the first structural member 21 film. Further, the lower surface of the first structural member 21 film was put upon the upper surface of the circuit board 1 film. The above body in which the layers were stacked as described above was subjected to hot press (80° C., 40 kgf/cm$^2$) for about 10 minutes and then cooled. In this way, a lamination body was made.

In the communicating holes formed in this lamination body, electronic parts were incorporated by a common method, and wire bonding was conducted on this lamination body if necessary.

Next, into the above communication holes, a resin encapsulant made of ferrite particles and soft epoxy resin was charged. It is preferable that epoxy resin, the hardness of which is higher than the hardness of polyester resin composing the structural member 2, is charged into the communication holes instead of the above resin encapsulant, because the electronic parts can be more strongly protected from a force given to the IC card from the outside. After curing, this resin encapsulant forms an encapsulant layer 3 to encapsulate the electronic parts located in the communication holes.

Next, a cover sheet 4 was arranged in a portion surrounding the above communication hole. On the lower surface of the label sheet film composing the label sheet 51, a predetermined quantity of the same adhesive agent as described before was coated, so that an adhesive agent layer 513 of 50 µm thickness could be formed in the final product and also an adhesive agent layer 513 of 85 µm thickness could be formed in a portion where the label sheet was not provided in the final product. After that, the label sheet 51 was arranged on the upper surface of the above lamination body.

On the upper surface of the label sheet film composing the label sheet 52, a predetermined quantity of the same adhesive agent as described before was coated so that an adhesive layer 522 of 85 μm thickness could be formed in the final product. After that, the label sheet 52 was arranged on the lower surface of the above lamination body. Then the lamination body was subjected to hot press (150° C., 40 kgf/cm²) for about 10 minutes and then cooled.

Next, in a portion of each label sheet film corresponding to each piece of the final product, predetermined characters and numbers, for example, characters and numbers corresponding to the name of a bank in the case of the use of a debit card, were printed. In this way, an IC card arrangement board having 6 pieces of IC cards was manufactured.

This arrangement board was cut into pieces by a common cutting method. In this way, the IC card of this embodiment was made.

In this connection, thus obtained IC card meets the requirements of ISO Standard (85 mm×53 mm×0.76 mm).

In the manufacture of the above IC card, it is not necessary to make a single body of the IC module which takes time and raises the cost. Further, it is not necessary either to match the outer shape of the IC module with the shape of the hole in which the IC module is embedded, so that a complicated work can be avoided.

Only when the size (the total length of the outer circumference) of each opening 215, 225 formed in each structural member 21, 22 is appropriately adjusted, it is possible to form a flange-shaped step portion on the inner wall of the communication hole. Due to the fluidity of an encapsulant charged into this communication hole, the communication hole is filled with the encapsulant. Therefore, it is possible to form an encapsulant layer 3, the outer circumferential shape of which is the same as the shape of the inner wall of the communication hole. In this connection, in case blow holes are formed in the step portion in the communication hole in the process of formation of the encapsulant layer 3, a small through-hole for breathing may be formed in the periphery of the opening 225 of the second structural member 22.

Due to the arrangement described above in detail, even when the IC card of the present invention is mistakenly bent while it is carried, the above step portion tightly holds the encapsulant layer 3, so that the electronic parts mounted on the IC card can be prevented from coming off.

Due to the existence of the above step portion, even when the electronic part mounting device is more intensely bent and the encapsulant layer to encapsulate the electronic parts attempts to separate from the second opening portion, the separation is stopped at a position close to the surface of the second opening portion, so that the separation does not reach the first opening portion.

The IC card of the present invention is composed in such a manner that the second structural member 22 is arranged on the first structural member 21 which is the center of the lamination body, and that the circuit board 1 is arranged below the first structural member 21, so that the characteristic of the lamination body such as a thermal expansion characteristic, and the shape (especially the thickness) of the lamination body, are symmetrical in the upward and downward direction. Therefore, the entire lamination body is not greatly warped. As a result, the production efficiency can be further enhanced, and the electronic parts can be more positively prevented from coming off. Since an inexpensive thin sheet of polyester film of high quality is positively used for the electronic part mounting device of the present invention, the quality of the product can be more positively enhanced, and the cost can be more positively reduced.

Embodiment 2

Figure 4:
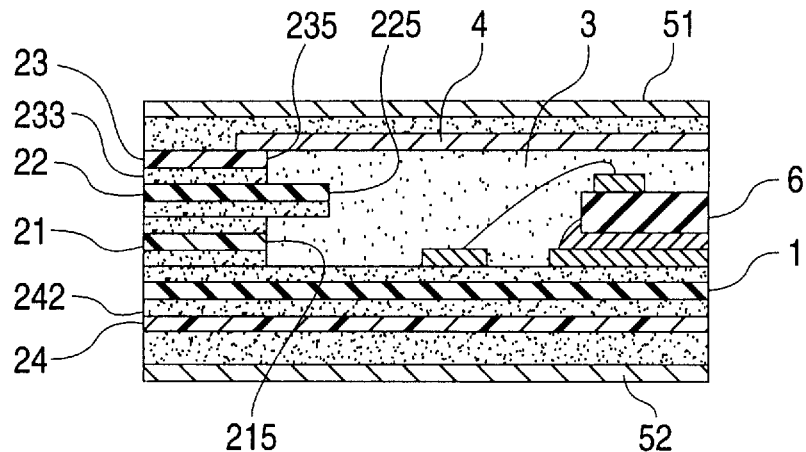

An IC card of this embodiment is shown in FIG. 4. On the upper side of the second structural member 22 having the same opening 225 as that of Embodiment 1, there is provided an auxiliary structural member 23 having the same auxiliary opening 235 as the opening 215. On the lower side of the same circuit board 1 as that of Embodiment 1, there is provided an auxiliary circuit board member 24.

In this case, the thickness of each of the second structural member 22, auxiliary structural member 23, circuit board 1 and auxiliary circuit board member 24 is determined to be 60 μm. Further, in order to make the overall thickness of the IC card to meet the requirements of ISO Standard, the thickness of each adhesive layer is changed. Except for the above points, the IC card of this embodiment is the same as that of Embodiment 1. Both the auxiliary structural member 23 and the auxiliary circuit board member 24 are formed from sheets of film of polyester resin used for the circuit board 1 in Embodiment 1. Accordingly, the second structural member 22 and the circuit board 1 are arranged in a symmetrical relation with respect to the upward and downward direction, and also the auxiliary structural member 23 and the auxiliary circuit board member 24 are arranged in a symmetrical relation with respect to the upward and downward direction.

In the IC card of this embodiment, the shape of the second structural member 22 is composed in such a manner that it bites into the encapsulant layer 3. Accordingly, compared with the electronic parts in Embodiment 1, the electronic parts can be more strongly prevented from coming off in Embodiment 2.

The longitudinal cross-sectional structure of the IC card of this embodiment is symmetrical. Accordingly, even when the electronic parts are mounted on the IC card, the occurrence of a great warp can be prevented. The circuit board 1, first structural member 21, second structural member 22, auxiliary structural member 23 and auxiliary circuit board member 24 are formed from considerably thin sheets of film (60 μm). Consequently, although the cost is low, the mechanical strength is high.

Figure 5:
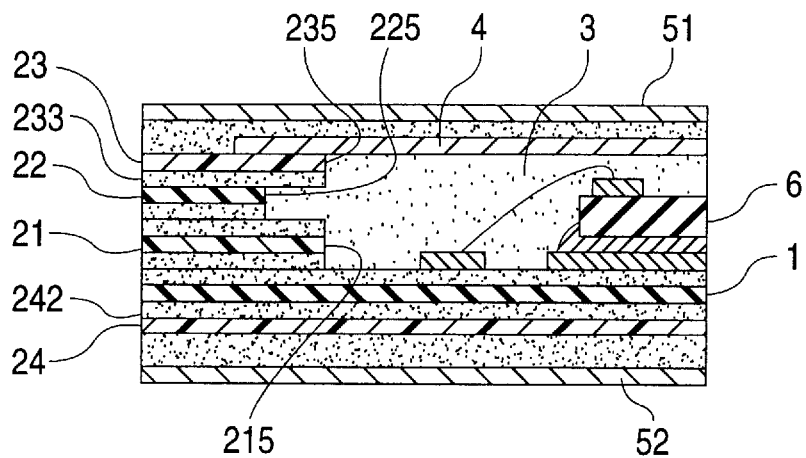
Figure 6:
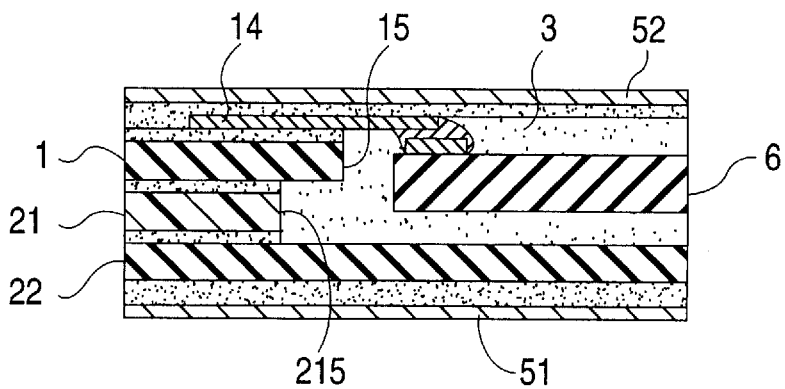

Finally, a variation of the second embodiment by which the same effect can be provided is exemplarily shown in FIG. 5. In the same manner, a variation of the first embodiment is exemplarily shown in FIG. 6. Like reference characters are used to indicate like parts in FIGS. 1 to 4.

INDUSTRIAL APPLICABILITY

According to the first invention and the second one, even if the electronic part mounting device is bent, the encapsulant layer to encapsulate the electronic part is engaged with the circuit board or the structural member arranged inside the outer circumferential line of the encapsulant layer, so that the electronic part can be prevented from coming off. Further, the electronic part mounting device of the invention can be easily manufactured. Therefore, the cost of the electronic part mounting device can be greatly reduced.

In addition to the effect provided by the second invention described above, in the electronic part mounting device of the third invention, even when the electronic part mounting device is more intensely bent and the encapsulant layer to encapsulate the electronic part is separated from the second opening, the separation appears only in a portion close to the surface of the second opening, and it does not reach the first opening. Consequently, it is more difficult for the electronic parts to come off from the electronic part mounting device.

In addition to the effect provided by the third invention described above, in the electronic part mounting device of the fourth invention, when this electronic part mounting device is manufactured, the first structural member and the second one are stacked on the upper surface of the circuit board, and after the electronic part has been mounted on the board, they are encapsulated by an encapsulant, and a surface member is arranged when necessary. As described above, the manufacturing process is simple. Therefore, it is not necessary at all to manufacture a complicated IC module which has been conventionally adopted. Consequently, the electronic part mounting device of the present invention can be easily and effectively manufactured.

In addition to the effect provided by the fourth invention described above, in the electronic part mounting device of the fifth invention, even if the temperatures of the circuit board and the structural members are changed so that the thermal expansion and shrinkage are caused, since the first structural member is interposed between the circuit board and the second structural member, they are expanded and shrunk in the substantially same conditions. Consequently, it is difficult for the electronic part mounting device of the invention to warp when it is manufactured and used.

In addition to the effect provided by the fifth invention described above, in the electronic part mounting device of the sixth invention, an inexpensive thin sheet of polyester film, the thermal expansion property of which is excellent, is positively used. In other words, the cost of this electronic part mounting device is very low, and the quality is very high.

The electronic part mounting device of the seventh invention proposes an IC card to which the effects of the first, second, third, fourth, fifth and sixth invention are remarkably requested.

We claim:

1. An electronic part mounting device comprising: a lamination body composed of a circuit board and a structural member; an electronic part attached in an opening formed in the lamination body; and an encapsulant layer to encapsulate the electronic part, wherein an outer circumferential line of the opening is arranged inside an outer circumferential line of the encapsulant layer so that the lamination body engages the encapsulant layer.

2. The electronic part mounting device according to claim 1, CHARACTERIZED in that said opening is composed of said structural member laminated on said circuit board.

3. The electronic part mounting device according to claim 2, CHARACTERIZED in that said structural member includes: a first structural member having a first opening, arranged on an upper surface side of said circuit board; and a second structural member having a second opening communicated with the first opening, arranged on an upper surface side of the first structural member, and an outer circumferential line of the first opening is arranged outside of an outer circumferential line of the second opening.

4. The electronic part mounting device according to claim 3, CHARACTERIZED in that said circuit board is made of thermoplastic resin, the length and width of which are substantially the same as those of the final product, said first structural member is mainly made of thermoplastic resin, the length and width of which are substantially the same as those of the circuit board, the first structural member is made to adhere onto an upper surface side of the circuit board with a thermoplastic adhesive agent which is softened at a temperature lower than the softening point of the thermoplastic resin of the circuit board, said second structural member is made to adhere onto an upper surface side of the first structural member with the substantially same adhesive agent as the above thermoplastic adhesive agent, the length and the width of the second structural member are substantially the same as those of the circuit board, and said encapsulant layer is more rigid than the circuit board and the first structural member.

5. The electronic part mounting device according to claim 4, CHARACTERIZED in that the thickness of said second structural member is substantially the same as the thickness of said circuit board, and the second structural member is made of substantially the same resin as the resin of the circuit board.

6. The electronic part mounting device according to claim 5, CHARACTERIZED in that said thermoplastic resin is a sheet of polyester film subjected to biaxial orientation and heat-stabilization, and said first structural member is made of the substantially same resin as the resin of said circuit board.

7. The electronic part mounting device according to claim 1, CHARACTERIZED in that said electronic part mounting device is an IC card.

* * * * *